United States Patent
Dunn et al.

(10) Patent No.: US 7,211,507 B2
(45) Date of Patent: May 1, 2007

(54) PE-ALD OF TAN DIFFUSION BARRIER REGION ON LOW-K MATERIALS

(75) Inventors: Derren N. Dunn, Fishkill, NY (US); Hyungjun Kim, Lagrangeville, NY (US); Stephen M. Rossnagel, Pleasantville, NY (US); Soon-Cheon Seo, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 328 days.

(21) Appl. No.: 10/709,865

(22) Filed: Jun. 2, 2004

(65) Prior Publication Data
US 2005/0269703 A1    Dec. 8, 2005

(51) Int. Cl.
*H01L 21/285*    (2006.01)
(52) U.S. Cl. ............... 438/627; 438/653; 257/E21.584
(58) Field of Classification Search ............... 438/627, 438/653, FOR. 350, 751; 257/E21.584
See application file for complete search history.

(56) References Cited

U.S. PATENT DOCUMENTS

| | | | |
|---|---|---|---|
| 2003/0124262 A1* | 7/2003 | Chen et al. | 427/404 |
| 2004/0009307 A1* | 1/2004 | Koh et al. | 427/569 |
| 2005/0095443 A1* | 5/2005 | Kim et al. | 428/469 |
| 2005/0101132 A1* | 5/2005 | Kim et al. | 438/687 |
| 2005/0269703 A1* | 12/2005 | Dunn et al. | 257/751 |
| 2006/0019494 A1* | 1/2006 | Cao et al. | 438/680 |
| 2006/0027167 A1* | 2/2006 | Ishizaka et al. | 118/715 |
| 2006/0094219 A1* | 5/2006 | Soda | 438/597 |

OTHER PUBLICATIONS

Rossnagel, S.M., et al., "Plasma-Enhanced Atomic Layer Deposition of Ta and Ti for Interconnect Diffusion Barriers", J Vac Sci Technol B 18(4), Jul./Aug. 2000, pp. 2016-2020.*

* cited by examiner

*Primary Examiner*—George Fourson
(74) *Attorney, Agent, or Firm*—Lisa U. Jaklitsch; Hoffman, Warnick & D'Alessandro LLC

(57) ABSTRACT

Methods of depositing a tantalum-nitride (TaN) diffusion barrier region on low-k materials. The methods include forming a protective layer on the low-k material substrate by performing plasma-enhanced atomic layer deposition (PE-ALD) from tantalum-based precursor and a nitrogen plasma in a chamber. The protective layer has a nitrogen content greater than its tantalum content. A substantially stoichiometric tantalum-nitride layer is then formed by performing PE-ALD from the tantalum-based precursor and a plasma including hydrogen and nitrogen. The invention also includes the tantalum-nitride diffusion barrier region so formed. In one embodiment, the metal precursor includes tantalum penta-chloride ($TaCl_5$). The invention generates a sharp interface between low-k materials and liner materials.

20 Claims, 6 Drawing Sheets

- TaNx deposition by N plasma only
- N/Ta - 1.3, p = 105 $\mu\Omega$ cm
- Low C1 (<1%)

PE-ALD OF TAN DIFFUSION BARRIER REGION ON LOW-K MATERIALS

BACKGROUND OF INVENTION

1. Technical Field

The present invention relates generally to diffusion barriers, and more particularly, to methods for plasma enhanced atomic layer deposition of a tantalum-nitride diffusion barrier region on low-k materials that generates a sharp barrier interface.

2. Related Art

Atomic layer deposition (ALD) has been recently studied for semiconductor interconnect technology, especially for liner applications. ALD is a layer-by-layer thin film deposition technique that implements alternating exposure of chemical species. Among the various metal liners for copper (Cu) interconnect technology, tantalum-based (Ta) materials are one of the most widely used because they provide: high thermal and mechanical stability and diffusion barrier properties, and good adhesion, all of which result in good reliability. Conventional integration schemes include the deposition of a tantalum/tantalum nitride (Ta/TaN) bilayer for use as a copper (Cu) diffusion barrier by physical vapor deposition (PVD). One shortcoming of this approach, however, is that the poor conformality of the PVD technique, caused by the directional nature of the technique, has become a potential problem as device technology migrates toward a sub 100 nm regime.

Potential problems presented by ALD include contaminant incorporation and the potential reaction between precursor and substrate materials. One particular material type that exacerbates these problems is low thermal conductivity (low-k) dielectrics, such as SiLK from Dow Chemical. For example, it is generally difficult to grow tantalum-based (Ta) materials on low-k materials by conventional thermal ALD. In particular, it is difficult to grow the materials at a low enough temperature for interconnect technology, requiring growth temperature below 400° C.

In order to address the above-identified problem, plasma enhanced ALD (PE-ALD) has been suggested as an alternative approach. One possible problem of PE-ALD is the common use of atomic hydrogen (H) as a reducing agent to deposit liner materials. The use of atomic hydrogen is especially problematic for spin on low-k dielectrics. In particular, SiLK is widely known to be reactive with atomic hydrogen (H) such that etching occurs when exposed to atomic hydrogen (H). Similarly, the PE-ALD of tantalum-nitride (TaN) is known to create a reaction between metal precursors and a plasma including hydrogen.

In view of the foregoing, there is a need in the art for a technique to deposit liner material without using atomic hydrogen.

SUMMARY OF INVENTION

The invention includes methods of forming a tantalum-nitride (TaN) diffusion barrier region on low-k materials. The methods include forming a protective layer on the low-k material substrate by plasma-enhanced atomic layer deposition (PE-ALD) from a tantalum-based precursor and a nitrogen plasma. A substantially stoichiometric tantalum-nitride layer is then formed by PE-ALD from the tantalum-based precursor and a plasma including hydrogen and nitrogen.

One aspect of the invention is directed to a tantalum-nitride diffusion barrier region for use with a low-k material, the layer comprising a protective layer adjacent the low-k material and a substantially stoichiometric tantalum-nitride diffusion barrier layer adjacent the protective layer. The protective layer include a tantalum-nitride material having a nitrogen content greater than a tantalum content.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 1:
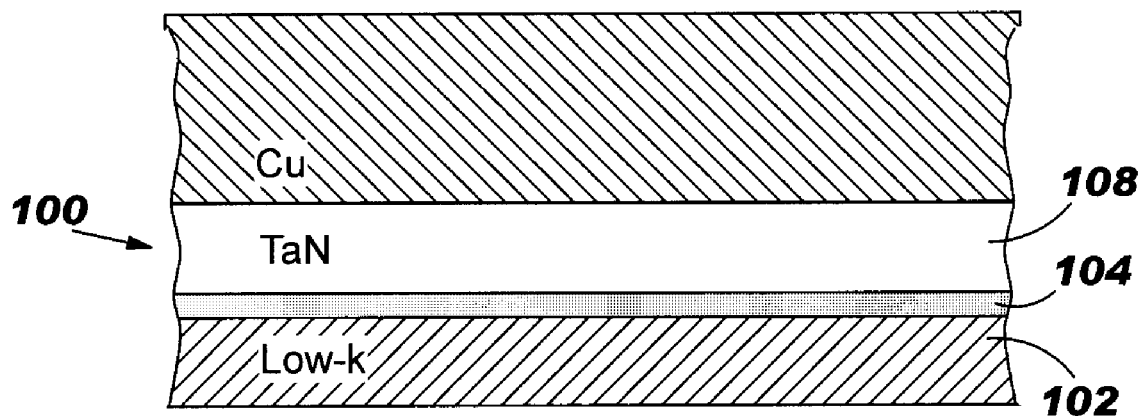
FIG. 1 shows a schematic cross-section view of a tantalum-nitride diffusion barrier region according to the invention.

Referring to the accompanying drawings, FIG. 1 illustrates a tantalum-nitride (TaN) diffusion barrier region 100 for use with a low-k material 102 according to the invention. Barrier region 100 includes: a protective layer 104 including a TaN material having a nitrogen content greater than a tantalum content adjacent low-k material 102; and a subsequent substantially stoichiometric TaN diffusion barrier layer 108 adjacent to protective layer 104. As will be described further below, there is substantially no reaction between low-k material 102 (e.g., SiLK) and protective layer 104, resulting in a very smooth and sharp interface. In addition, protective layer 104 successfully prevents the interaction of atomic hydrogen (H) with the SiLK layer 102 during the later formation of substantially stoichiometric TaN layer 108, and allows layer 108 to be successfully grown even on low-k material (e.g., SiLK) 102.

Figure 2:
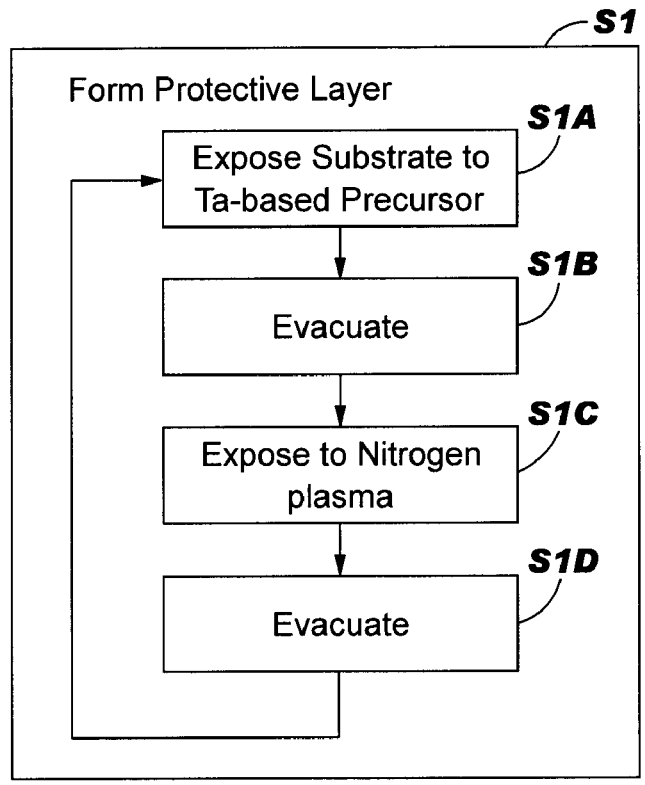
FIG. 2 shows a flow diagram of a method for generating the TaN diffusion barrier region according to the invention.
Figure 2:
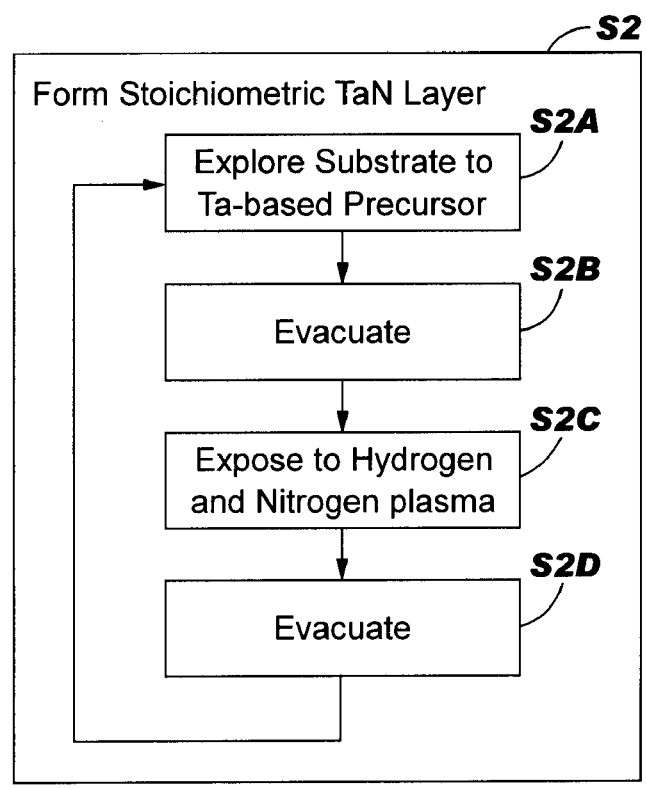

Turning to FIG. 2, a flow diagram of a method of forming a high nitrogen TaN protective layer 104 and substantially stoichiometric TaN diffusion barrier using plasma-enhanced atomic layer deposition (PE-ALD) according to the invention is shown. It should be recognized that the invention will be described relative to one illustrative application of the methods to a sample. The invention, however, is not to be limited to the particular illustrative application's operational parameters, e.g., temperature, pressure, etc., except as delineated by the attached claims.

As illustrated, the method includes repeating a number of cycles as would be expected for a PE-ALD technique. In one illustrative embodiment, the method is carried out in a noncommercial ALD chamber capable of handling sample sizes as large as 200 mm diameter. The chamber may include a reactive-gas grade turbo molecular pump with a working base pressure of $10^{-7}$ Torr. Sample heating may be conducted using a ceramic resistive heating plate, which provides growth temperatures up to 450° C. The method, in one embodiment, runs at approximately 300° C. The temperature may be controlled by varying current to the heater, which may be calibrated against a thermocouple attached to the sample.

In a first step S1, protective layer 104 (FIG. 1) is formed on low-k material substrate 102 (FIG. 1) by PE-ALD from a tantalum-based precursor and a nitrogen plasma. In particular, in step S1A, the substrate is exposed to a tantalum-based precursor. In one embodiment, solid tantalum pentachloride ($TaCl_5$) (in powder form) contained in a glass tube was used as the tantalum-based precursor. However, tantalum pentaiodide ($TaI_5$), tantalum pentafluoride ($TaF_5$), or tantalum pentabromide ($TaBr_5$), may also be substituted. The glass tube may be maintained at a temperature, e.g., 90° C., to develop adequate vapor pressure. In addition, delivery lines may be heated between 90–110° C. to prohibit condensation of the precursor. To improve the delivery of the tantalum-based precursor, a carrier gas including, e.g., argon (Ar), may be used, the flow of which may be controlled by a mass flow controller upstream from the source tube. In one embodiment, the substrate is exposed to >1000 Langmuirs (L) of $TaCl_5$ carried by Ar gas. A Langmuir equals exposure for is at $10^{-6}$ Torr. Substrates upon which the method may be implemented include any low-k material such as: silicon dioxide ($SiO_2$), hydro-fluoric (HF) dipped silicon (Si), and a low-k dielectric material such as SiLK on silicon dioxide ($SiO_2$). Other substrates are possible, however.

In step S1B, the chamber may be evacuated, e.g., using an evacuation pump. In one embodiment, no purging gas is used between metal precursor and plasma exposure (step S1C or step S2C below). However, it should be recognized that a purging gas may be used, which should not change the result of the method.

In step S1C, the substrate is exposed to nitrogen plasma. In this step, a gate valve for nitrogen is opened for a radio frequency (RF) source. The RF plasma source may be any conventional plasma source including, for example, a quartz tube wrapped with copper (Cu) coil for producing the plasma. PE-ALD from the tantalum-based precursor in the nitrogen plasma (without hydrogen) results in formation of TaN protective layer 104 (FIG. 1) having a higher nitrogen content than tantalum, the benefits of which will be described below.

In step S1D, the chamber may be evacuated again and one cycle of PE-ALD to form protective layer 104 (FIG. 1) is completed. As shown in FIG. 2, step S1 may be repeated for a number of cycles, which determines the thickness of protective layer 104 (FIG. 1).

Next, in step S2, subsequent substantially stoichiometric TaN diffusion barrier layer 108 (FIG. 1) is formed by PE-ALD from the tantalum-based precursor and a plasma of hydrogen and nitrogen. Steps S2A–S2D represent a repeating of steps S1A–S1D with a change in the plasma to include hydrogen and nitrogen. In this step, a gate valve for hydrogen and nitrogen is opened for a radio frequency (RF) source. A balance between tantalum and nitride content in TaN diffusion barrier layer 108 (FIG. 1) is controlled by controlling the flows of nitrogen (N) and/or hydrogen (H) via one or more leak valves. As shown in FIG. 2, step S2 may be repeated for a number of cycles, which determines the thickness of the substantially stoichiometric TaN diffusion barrier layer 108 (FIG. 1).

In any event, the number of cycles of protective layer 104 (FIG. 1) formation is less than the number of cycles in which the substantially stoichiometric TaN layer 108 (FIG. 1) is formed, i.e., the substantially stoichiometric TaN layer is thicker. In one embodiment, the number of cycles employed was 100 cycles for the protective layer and 800 cycles for substantially stoichiometric TaN diffusion barrier layer.

Figure 3:
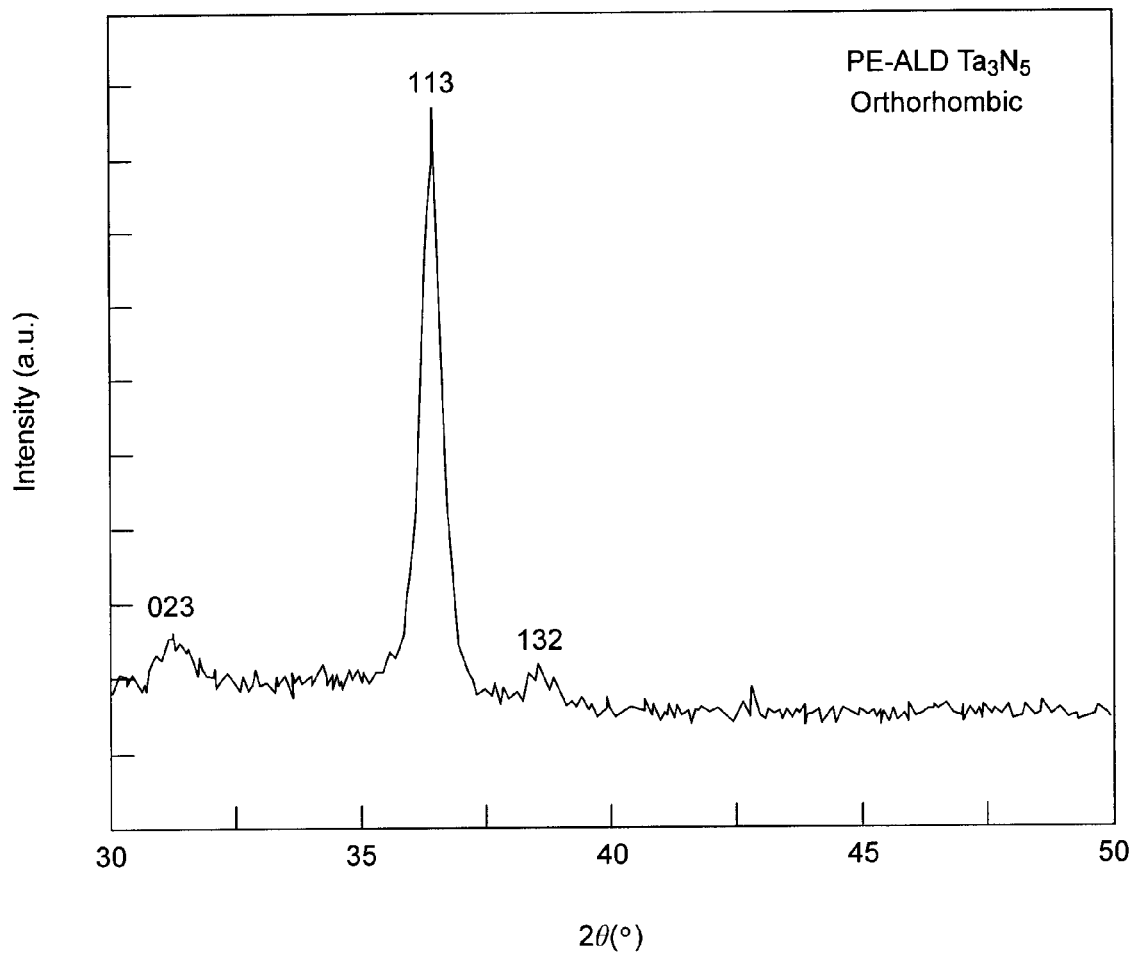
FIG. 3 shows a XRD spectrum for a high nitrogen TaN protective layer created by the method of FIG. 2.
Figure 4:
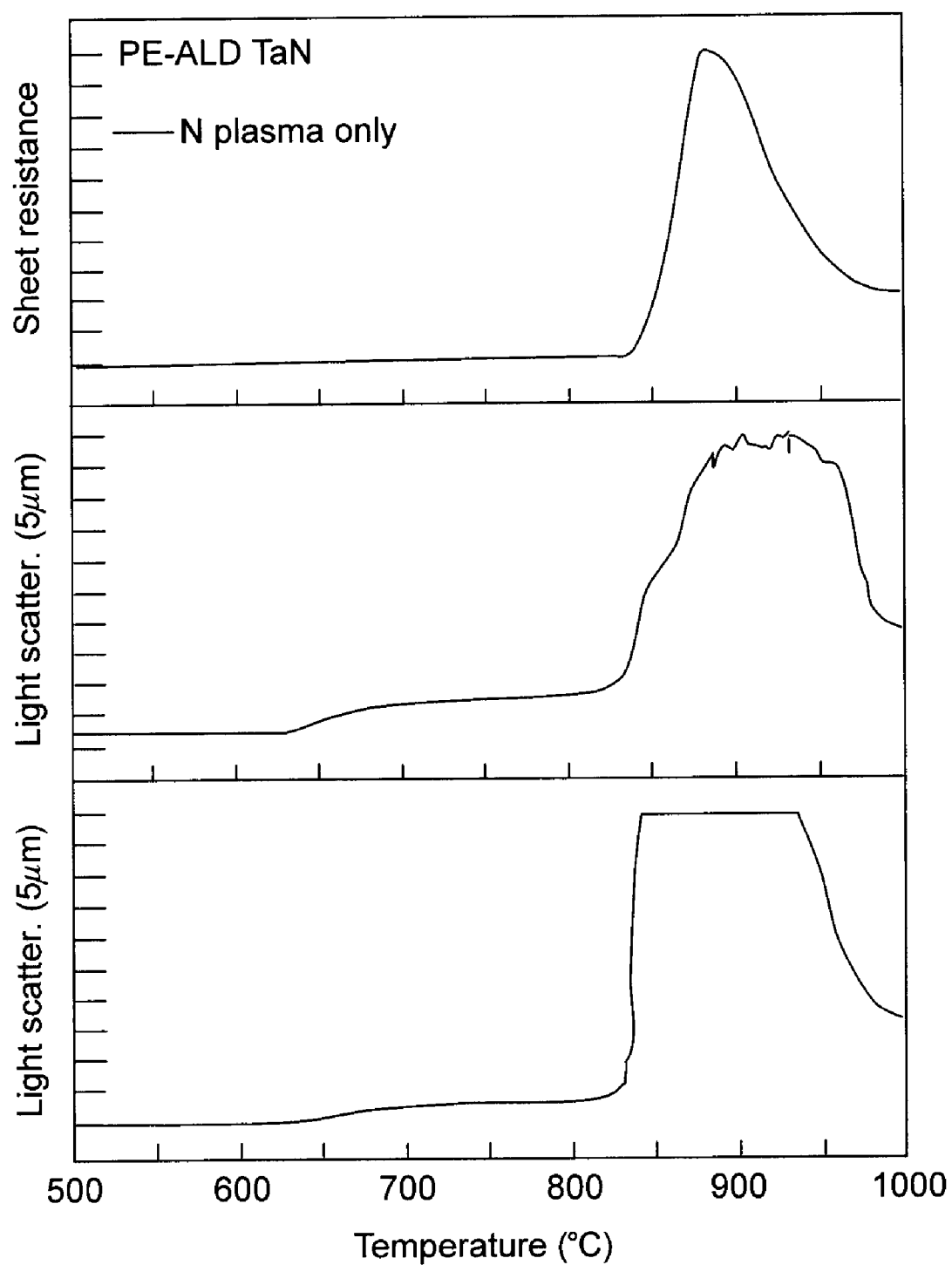
FIG. 4 shows light scatter and sheet resistance graphs for the high nitrogen TaN protective layer during thermal annealing.

To illustrate the physical properties of protective layer 104 (FIG. 1), reference is made to FIG. 1 in conjunction with FIGS. 3–4. Referring to FIG. 3, an illustrative x-ray diffraction (XRD) spectrum of protective layer 104 deposited using a tantalum-base precursor in the form of $TaCl_5$ and a nitrogen plasma is shown. Even without atomic H, with only nitrogen plasma, protective layer was deposited. RBS analysis has shown that for an illustrative 1200 cycle deposition, $1.360 \times 10^{17}$ $cm^2$ of tantalum (Ta) atoms can be deposited with a nitrogen-to-tantalum (N/Ta) ratio of 1:3. While the XRD pattern has been noted to indicate a $Ta_3N_5$ phase, other high nitrogen content $TaN_x$ phases such as $Ta_4N_5$ and $Ta_5N_6$ may also be present because all these phases have similar XRD peaks. In particular, the diffraction pattern is very close to the pattern known in the art to be obtained for $Ta_3N_5$ phase deposited by tantalum penta-chloride ($TaCl_5$) and ammonia ($NH_3$). However, the chloride (Cl) content that was deposited using $NH_3$ is high at approximately 300° C. by about 5%. For a nitrogen plasma process, however, the Cl content was below 0.5%, which indicates that the efficiency of chloride (Cl) extraction of the nitrogen plasma is at least comparable to that of hydrogen plasma.

Turning to FIG. 4, copper (Cu) diffusion barrier properties were studied by thermal annealing, and obtaining sheet resistance and optical scattering results for an protective layer deposited to, for example, about 25 Å thickness. In particular, copper (Cu) diffusion barrier failure was studied using two different in situ techniques, conducted simultaneously, while the sample was annealed in a forming gas at a temperature ramp rate of 3° C./s from 100 to 1000° C. Temperature was monitored using a K-type thermocouple, which was calibrated using eutectic melting points of various metals in contact with silicon (Si) for an accuracy of ±3° C. First, for optical scattering, a chopped helium-neon (HeNe) laser beam was brought into the annealing chamber through a fiber optic cable and focused through a lens onto the sample surface at an incidence angle of 65° forming a spot size of 1×2 mm. The scattered intensities were measured using two bare fibers positioned at 50° and −20° allowing for measurement of lateral length scales of approximately 5 mm and 0.5 mm, respectively. For detection of only the chopped HeNe light scattered from the sample surface, lock-in amplifiers were used with silicon (Si) photodiodes and interference filters, which removed background light at other wavelengths. This optical scattering technique detects changes in the scattered intensity from surface roughness and also changes in index of refraction that the barrier failure may cause (e.g., coexistence of multiple phase composition domains).

The second in situ technique used was a four-point probe sheet resistance measurement as a function of temperature. Four spring-loaded tantalum (Ta) probes arranged approximately in a square geometry maintained contact with the sample surface while 25 mA of current passes through two of the probes, and voltage is measured across the other two. This allowed for a relative sheet resistance measurement that is scaled using a room temperature, absolute measurement made with a fixed in-line four-point probe geometry.

As shown in FIG. 4, protective layer 104 has a thermal stability of greater than approximately 820° C., which is a much higher temperature compared to a substantially stoichiometric TaN ALD layer, which fails around 620° C. (not shown). This indicates that the protective layer alone is a good diffusion barrier, but the high resistivity of the layer might be a problem in device application.

To illustrate the advantages of the present invention when applied to low-k dielectrics such as SiLK, reference is made to FIGS. 5A–5B and 6A–6B, which show the results of number of test analysis on two different samples prepared on SiLK material. The samples were prepared by the deposition of ALD $TaN_x$ on 150 nm polycrystalline silicon to electrically isolate the silicon substrate during the sheet resistance analysis. The first sample (FIGS. 5A and 6A) was prepared using a conventional PE-ALD cubic TaN layer deposition using hydrogen and nitrogen mixture plasma. The second sample (FIGS. 5B and 6B) was generated according to the invention. In terms of the second sample, the method included protective layer formation (nitrogen-only plasma) for 100 cycles followed by a substantially stoichiometric TaN layer formation (hydrogen and/or nitrogen) for 800 cycles. Analytical transmission electron microscopy (hereinafter "TEM") was completed for both samples (FIGS. 5A–5B) to see the sharpness of the interface and surface roughness. Composition and thickness were determined by Rutherford backscattering spectrometry (hereinafter "RBS").

Figure 5A:
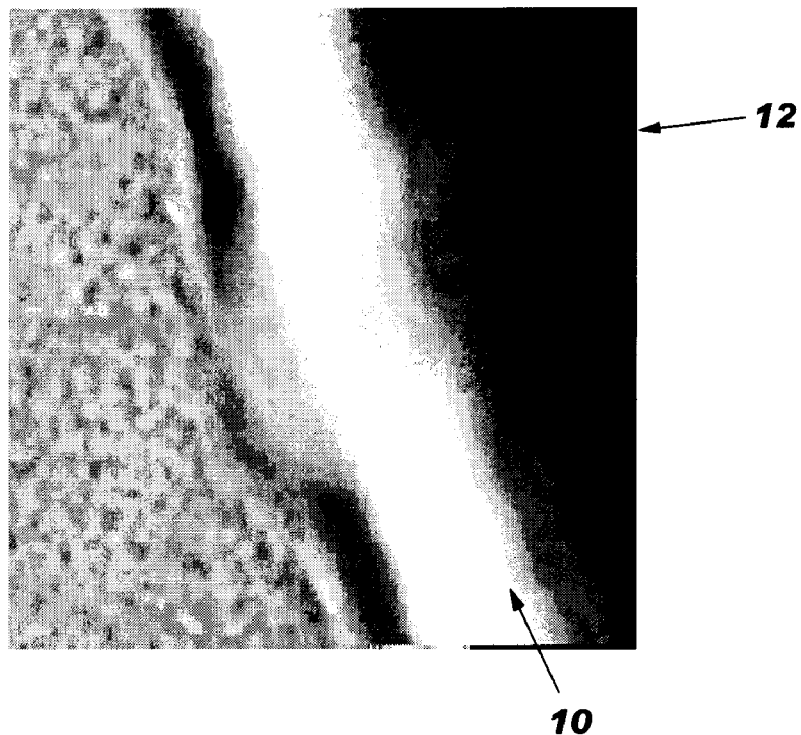
FIGS. 5A–5B show transmission electron microscope images of diffusion barrier layer samples; and, FIGS. 6A–6B show micro energy dispersed x-ray (EDX) data graphs for the diffusion barrier region samples of FIGS. 5A–5B.
Figure 5B:
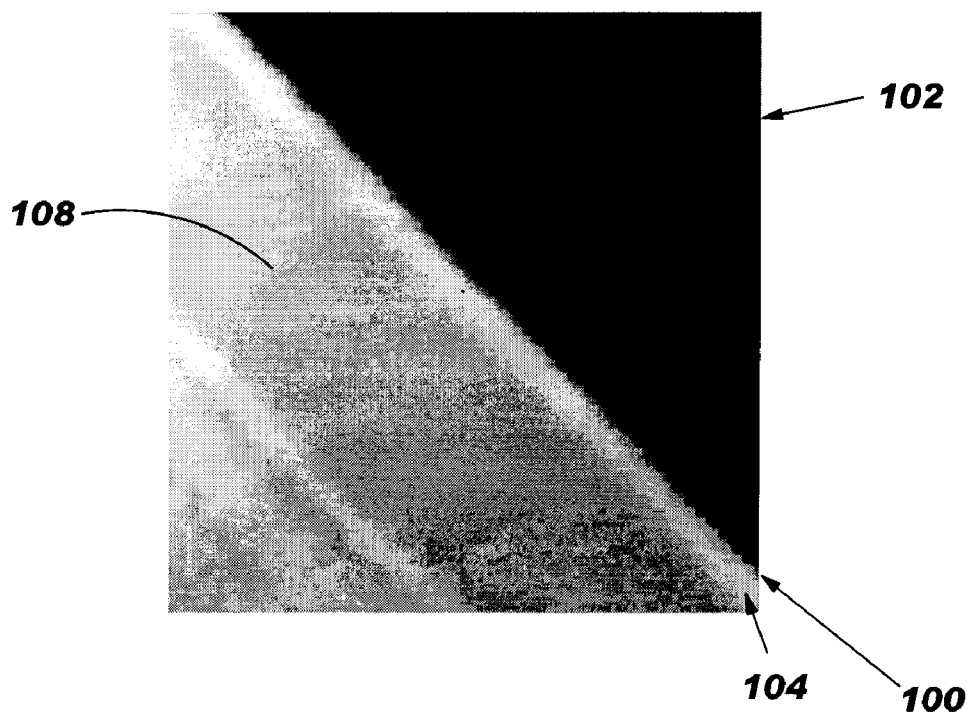

FIG. 5A shows TEM analysis of deposition of tantalum-nitride on low-k material (e.g., SiLK) according to the prior art approach, and FIG. 5B shows TEM analysis of deposition of $TaN_x$ on low-k material (e.g., SiLK) according to the present invention. As noted above, low-k materials such as SiLK are vulnerable when exposed to atomic H during plasma deposition. FIG. 5A illustrates the results of a hydrogen plasma to deposit substantially stoichiometric TaN layer 10 on SiLK layer 12. After deposition for 800 cycles, macroscopic delamination is observed for the films, resulting from the reactivity of SiLK with the hydrogen plasma. In particular, the interface is very rough between TaN layer 10 and SiLK layer 12, and mixing is clearly visible.

In contrast, FIG. 5B illustrates a TEM image of a second sample that was prepared according to the invention. As seen in FIG. 5B, there is substantially no reaction between low-k material 102 (e.g., SiLK) and protective layer 104, resulting in a very smooth and sharp interface. This result indicates that protective layer 104 successfully prevents the interaction of atomic hydrogen (H) with the SiLK layer 102 during the later formation of TaN diffusion barrier layer 108, and allows layer 108 to be successfully grown even on low-k material (e.g., SiLK) 102.

Figure 6A:
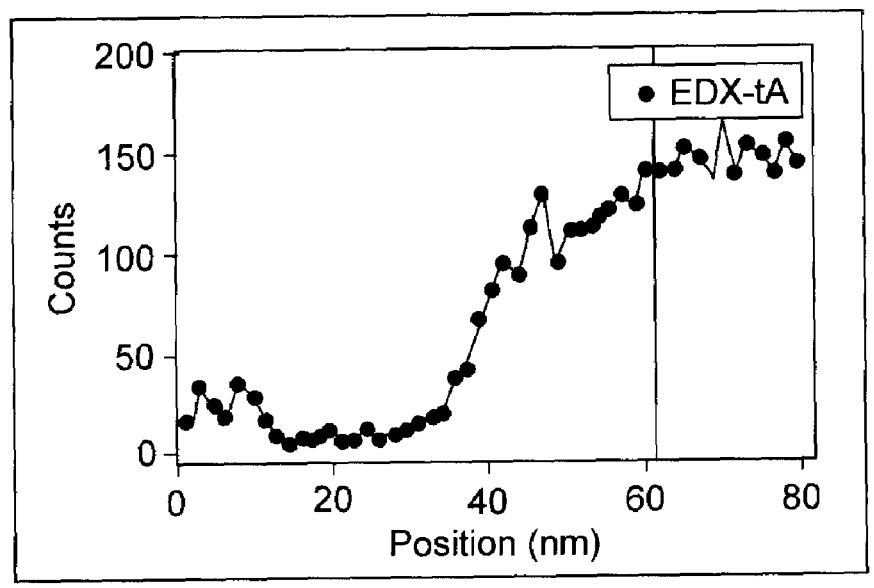
Figure 6B:
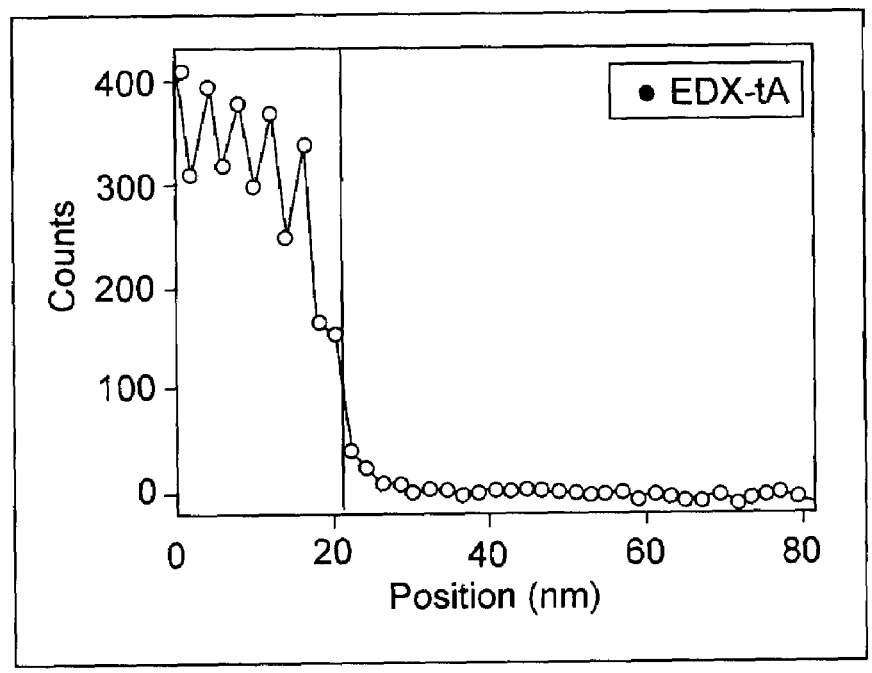

FIGS. 6A–6B illustrate micro energy dispersed x-ray (EDX) data that has been obtained for the samples shown in FIGS. 5A–5B, respectively. In FIG. 6A, the conventional tantalum (Ta) profile shows severe intermixing and the interface is very diffuse. In contrast, FIG. 6B shows the tantalum (Ta) profile generated by the present invention in which the profile shows very little, if any, intermixing and a very smooth interface.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of forming a tantalum-nitride diffusion barrier region on a low-k material substrate, the method comprising the steps of:

forming a protective layer on the low-k material substrate by plasma-enhanced atomic layer deposition (PE-ALD) from a tantalum-based precursor and a nitrogen only plasma; and forming a subsequent substantially stoichiometric tantalum-nitride diffusion barrier layer by PE-ALD from the tantalum-based precursor and a plasma of hydrogen and nitrogen.

2. The method of claim 1, wherein the tantalum-based precursor is selected from the group consisting of tantalum pentachloride ($TaCl_5$), tantalum pentaiodide ($TaI_4$ tantalum pentafluoride ($TaF_5$), and tantalum pentabromide ($TaBr_5$).

3. The method of claim 1, wherein each forming step further includes:

exposing the substrate to the tantalum-based precursor prior to the PE-ALD in a chamber; and evacuating the chamber after the PE-ALD.

4. The method of claim 1 wherein the protective layer forming step further includes providing a carrier gas for the tantalum-based precursor.

5. The method of claim 1 wherein the protective layer includes a higher content of nitrogen than tantalum.

6. The method of claim 1, wherein the protective layer forming step includes exposing the low-k material substrate for greater than 1000 Langmuirs.

7. The method of claim 1 wherein the low-k material substrate is selected from the group consisting of silicon dioxide ($SiO_2$) and hydro-fluoric (HF) dipped silicon (Si).

8. The method of claim 1 wherein the tantalum-nitride diffusion barrier layer is thicker than the protective layer.

9. A method of forming a tantalum-nitride diffusion barrier region on a substrate, the method comprising the steps of:

forming a protective layer on the low-k material substrate by conducting a first number of first cycles in a chamber, each first cycle including:

exposing the substrate to a tantalum-based precursor, evacuating the chamber, plasma-enhanced atomic layer depositing (PE-ALD) from the tantalum-based precursor and a nitrogen only plasma, and evacuating the chamber; and forming a subsequent substantially stoichiometric tantalum-nitride diffusion barrier layer by conducting a second number of second cycles in the chamber, each second cycle including:

exposing the substrate to a tantalum-based precursor, evacuating the chamber,

PE-ALD from the tantalum-based precursor and a plasma of hydrogen and nitrogen, and evacuating the chamber.

10. The method of claim 9, wherein the tantalum-based precursor is selected from the group consisting of: tantalum penta-chloride ($TaCl_5$), tantalum penta-iodide ($TaI_5$), tantalum penta-fluoride ($TaF_5$), and tantalum pentabromide ($TaBr_5$).

11. The method of claim 9, wherein the exposing steps further include providing a carrier gas for the tantalum-based precursor.

12. The method of claim 11, wherein the carrier gas includes argon.

13. The method of claim 9, wherein the protective layer includes a nitrogen content greater than a tantalum content.

14. The method of claim 9, wherein the protective layer forming step includes exposing the low-k material substrate for greater than 1000 Langmuirs.

15. The method of claim 9, wherein the substrate is selected from the group consisting of: silicon dioxide ($SiO_2$), hydro-fluoric (HF) dipped silicon (Si) and a low-k material.

16. The method of claim 9, wherein the first number of cycles is less than the second number of cycles.

17. A tantalum-nitride diffusion barrier region for use with a low-k material, the region comprising:

a protective layer adjacent the low-k material, the protective layer including a tantalum-nitride material having a nitrogen content greater than a tantalum content; and a substantially stoichiometric tantalum-nitride diffusion barrier layer adjacent the protective layer.

18. The barrier layer of claim 17, wherein there is substantially no diffusion of the low-k material and the protective layer.

19. The barrier layer of claim 17, wherein the tantalum-nitride material is selected from the group consisting of: $Ta_3N_5$, $Ta_4N_5$ and $Ta_5N_6$.

20. The barrier layer of claim 17, wherein the protective layer has a thermal stability of greater than approximately 820° C.

* * * * *